US007085390B2

United States Patent
Carter, Jr. et al.

(10) Patent No.: US 7,085,390 B2

(45) Date of Patent: Aug. 1, 2006

(54) METHOD FOR CONTROLLING MULTI-MODE AUDIO GAIN BALANCE

(75) Inventors: Charles H. Carter, Jr., Sunrise, FL (US); Karthik Narasimhan, Sunrise, FL (US)

(73) Assignee: Motorola, Inc., Schaumburg, IL (US)

(*) Notice: Subject to any disclaimer, the term of this patent is extended or adjusted under 35 U.S.C. 154(b) by 1095 days.

(21) Appl. No.: 09/849,320

(22) Filed: May 4, 2001

(65) Prior Publication Data

US 2002/0164039 A1 Nov. 7, 2002

(51) Int. Cl.

*H04R 3/00* (2006.01)
*H04R 1/02* (2006.01)
*H03G 3/00* (2006.01)

(52) U.S. Cl. .......................... 381/111; 381/107; 381/91

(58) Field of Classification Search ..................... None
See application file for complete search history.

(56) References Cited

U.S. PATENT DOCUMENTS 6,049,722 A * 4/2000 Umemoto et al. ....... 455/553.1
6,256,511 B1 * 7/2001 Brown et al. ............ 455/552.1
6,636,609 B1 * 10/2003 Ha et al. .................... 381/104

* cited by examiner

*Primary Examiner*—Laura A. Grier

(57) ABSTRACT

A method for controlling audio gain balance in a multi-mode communications device (200) includes providing (201) microphone audio input to the multimode communications device. The audio is supplied to an amplifier gain stage while a dynamic instantaneous energy value of the audio input is computed (203) when in a first operational mode such as an analog mode. A predetermined gain algorithm is processed (207) representing an audio input when in a second mode such as a digital mode using the energy value. The audio gain stage in the multi-mode communications device is then adjusted (209) so that audio gain when in the first mode substantially approximates an audio gain when in an second mode. This provides a consistent audio amplitude output when receiving the first and second modes in a radio receiver.

13 Claims, 1 Drawing Sheet

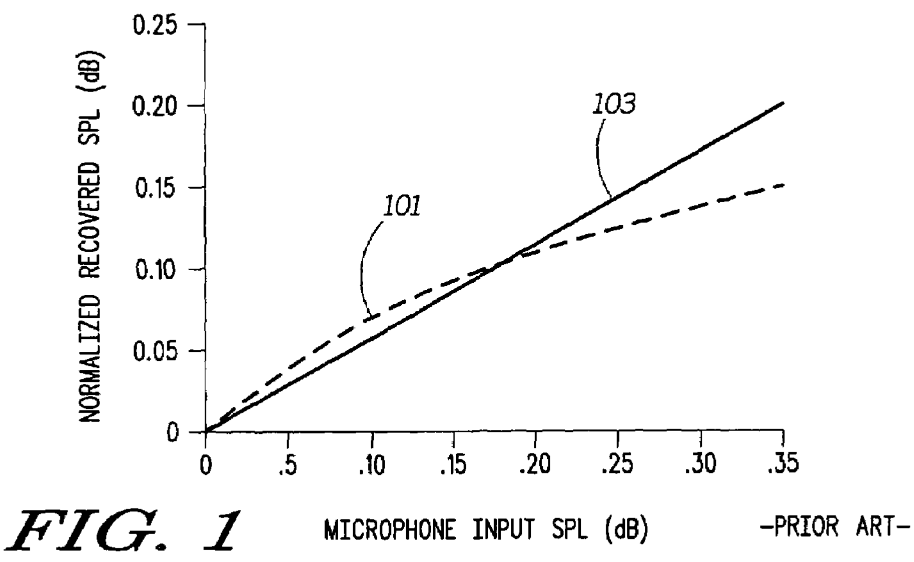
FIG. 1 -PRIOR ART-
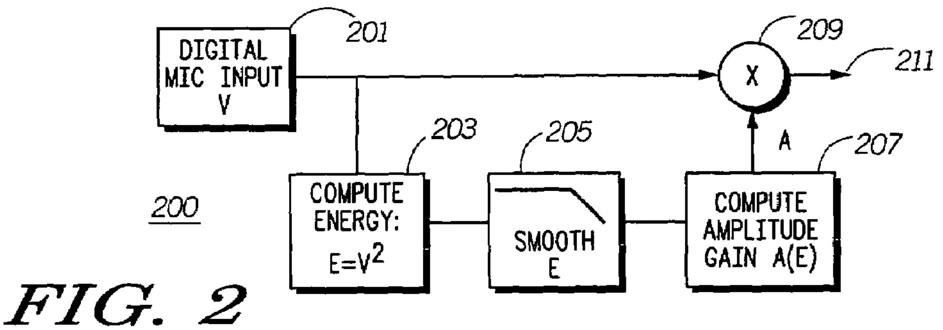
FIG. 2
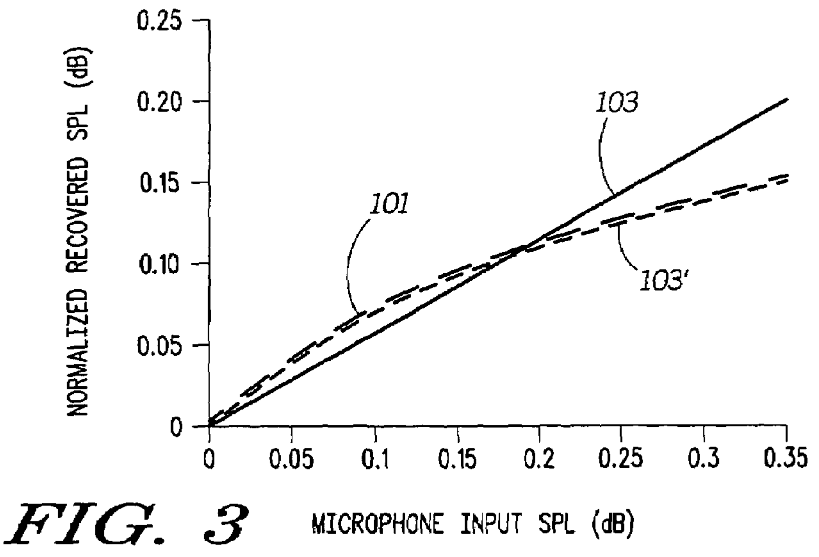
FIG. 3

METHOD FOR CONTROLLING MULTI-MODE AUDIO GAIN BALANCE

TECHNICAL FIELD

This invention relates in general to two-way radio transceivers and more particularly to audio levels in two-way radio transceivers.

BACKGROUND

Many two-way radio products today operate using both analog and digital modulation for voice modes. For example, the Association of Public Safety Communications Officials (APCO) 25 radio standard utilizes both standard analog frequency modulation (FM) and frequency division multiple access (FDMA) digital modulation. In practice, when the radio transceiver is switching between analog and digital modes, users listening to this radio may perceive changes in microphone input level. This manifests itself in the form of audio output signal levels having both high and low amplitudes. In the past, in order to prevent the listener from continually changing volume levels to compensate for this variance, the transmitter microphone input level was balanced by setting fixed gain levels in both the transmit and receive audio paths. This approach however has not always been effective, leading to an inconsistent or non-uniform audio output.

As seen in FIG. 1, when the received volume or audio output speaker level is plotted versus the transmitted or microphone input speaker level in an analog mode 101, the amplitude response curve is very non-linear. This non-linear shape results from the fact that audio is typically compressed while operating in an analog mode resulting in non-linear microphone audio gain. While in an analog mode, the system deviation can typically be set at approximately 60 percent of the maximum at an input level of approximately 95 decibel (dB) speaker pressure level (SPL). Therefore when the audio input signal level is greater than this level, the system deviation is limited by clipping at a preset level. This has the effect of compressing the amplitude of the transmitted analog audio signal leading to an analog volume curve 101 as seen in FIG. 1, which creates a non-linear response. In practice, this results in a system dynamic range of only a few dB while in an analog mode.

In a digital mode 103, there is no clipping circuit to limit maximum deviation, since the transmitted audio information is digitally encoded. Thus, digital mode transmissions have a much higher dynamic range than analog transmissions. Moreover, voice encoders or "vocoders" used in the digital mode encode digital audio and do not tolerate a compressed signal well. The vocoder tends to degrade audio quality when beyond a predetermined input level. These facts lead the digital transmit audio being linear instead of compressed as in the analog mode.

Consequently, these variations between audio in the analog and digital modes typically result in field complaints in audio output level in radio products. Users perceive that a radio is not operating properly since the volume levels in the analog and digital modes must be continually adjusted in order to achieve a constant amplitude level. Users may also complain that the digital mode is not tolerant of microphone input variations in mouth-to-speaker distances as it is while in the analog since compression tends to be compensate for variation in input levels.

In other words, the audio level in the digital modes is reduced at a greater rate as the user moves further from the microphone. This ultimately reduces microphone sensitivity below a users desired specifications. Further issues are created related to unintelligible audio at high volume levels when in the digital mode. This is due to the large dynamic range entering in to a "clip" or distortion where the analog mode is more forgiving and acts as a pseudo-automatic gain control by limiting the audio input level. Using a fixed gain to adjust one signal will only match the modes at one point.

Accordingly, the need exists to provide a method for the efficient control for audio microphone gain balance in two-way communications equipment operating in both an analog and digital modulation mode.

BRIEF DESCRIPTION OF THE DRAWINGS

FIG. 1 is a graph showing received audio output speaker level (dB) of a "normalized" speaker pressure level (dB) versus the transmitted or microphone input speaker pressure level(dB).

FIG. 2 is a block diagram showing the preferred method of adjusting gain balance in a multi-mode communications system.

FIG. 3 is a graph showing received audio output speaker level (dB) of a "normalized" speaker pressure level (dB) versus the transmitted or microphone input speaker pressure level (dB) where the digital input has been adjusted to match the analog input using the preferred method of the invention.

DETAILED DESCRIPTION OF THE PREFERRED EMBODIMENT

Referring now to FIG. 2, the preferred method and system for controlling multi-mode gain balance 200 includes a digital microphone input 201. Although depicted here as a "digital" input, it will be recognized by those skilled in the art that the invention is applicable to other transmission modes where the amplitude response of microphone input energy must be compensated or controlled to achieve a normalized and/or balanced output as compared to some predetermined reference level.

An object of the present method of the invention is to achieve a multi-mode gain balance by manipulating a calculated redeemed algorithm based upon a desired amplitude response. This algorithm represents a preferred signal such that, for example, an analog input signal is to emulate. This algorithm is stored in computational stage 207 where it is later processed in the forgoing steps.

The process includes taking the square of the microphone input voltage (V) to determine an approximate input energy calculation 203. Thus, $E=V^2$ where E is audio input energy and V is audio voltage. This energy calculation is input to a smoothing filter 205 in order to eliminate overly high or excessive peak values. The output of the smoothing filter 205 is directed to the desired amplitude gain algorithm A(E) where the normalized energy value is processed and/or computed 207 to alter and provide an instantaneous desired gain of amplifier stage 209. This ultimately provides a controlled output 211 which can approximate the values of a desired amplitude response such as an analog amplitude response as in this application.

Thus, computation of the gain polynomial is performed in the computation and control step 207. In this step, a mathematical model of the desired gain curve is created. This model is then applied using linear regression techniques to determine a polynomial which will take as an input an amplitude that is mathematically squared and map it to a first order gain value. This is accomplished by computing a polynomial using linear regression for both the digital and analog volume curves, using the input audio voltage levels as a guide. This is done so that neither square root calculation nor a mathematical division need be computed. This realizes a highly efficient digital signal processing (DSP) algorithm that can dynamically, continuously and instantaneously alter the gain of an amplifier stage to approximate a desired amplitude response.

Additionally, it should be evident that the method of controlling multi-mode gain balance as in the present invention is not the same process as used in automatic gain control (AGC) circuitry which tried to move the amplitude input to a fixed value. It also does not operate like a compression algorithm since, as is well known in the art, such an algorithm operates by mapping an instantaneous value to an amplitude response curve. No mapping is done using look-up tables or the like in the present invention and operates by determining an instantaneous compensation of a microphone input by using its voltage to determine a unique energy value. Although the current implementation scales the audio samples on the microphone to obtain volume balance, a similar procedure can also be used on the speaker samples to achieve a similar effect based on the particular application.

As seen in FIG. 3, the original digital value 103 is shown in the graph illustrating received volume or audio output speaker level versus the transmitted or microphone input speaker level. The processed digital signal 103' is also shown imposed on the original analog signal 101. This graph clearly shows the benefit of the invention as the digital microphone input now substantially matches the amplitude response of the analog microphone input. Thus, the method of the present invention achieves the desired result of controlling the multi-mode gain balance since the processed digital signal 103' now substantially has substantially the same amplitude response as the analog signal 101. In practice, this has the effect of providing a consistent amplitude audio output on a user's radio transceiver without the need for the user to continually adjust audio output volume level based on whether an analog or digital signal is being received.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for controlling audio gain balance in a multi-mode communications device comprising the steps of:

providing at least one microphone for inputting audio to the multimode communications device;

supplying the audio to at least one gain stage;

computing a dynamic instantaneous energy value of the audio input when in a first operational mode;

processing a predetermined gain algorithm representing an audio input when in a second operational mode using the energy value; and adjusting the at least one audio gain stage in the multi-mode communications device so that audio gain when in the first operational mode substantially approximates an audio gain when in an second operational mode.

2. A method for controlling audio gain balance as in claim 1, wherein the dynamic instantaneous energy value of the audio input is determined using a mathematical square of an audio voltage present at the at least one microphone.

3. A method for controlling audio gain balance as in claim 1, wherein the step of processing includes computing a polynomial using the dynamic instantaneous energy value.

4. A method for controlling audio gain balance as in claim 1, wherein the step of processing includes computing a polynomial which was determined using linear regression based on an energy value input and normalized energy outputs in both modes of operation.

5. A method for controlling audio gain balance as in claim 1, wherein the step of processing includes smoothing the dynamic instantaneous energy value to prevent peaks beyond a predetermined limit.

6. A method for controlling audio gain balance as in claim 1, wherein the first operational mode is an analog mode.

7. A method for controlling audio gain balance as in claim 1, wherein the second operational mode is a digital mode.

8. A method for balancing microphone audio gain in a communications device transmitting analog and digital voice comprising the steps of:

providing at least one microphone audio input to the communications device;

computing an instantaneous energy value of the audio microphone input when in a digital voice mode;

smoothing the instantaneous energy value using at least one filter for dampening peak values;

processing at least one gain algorithm representing an analog microphone audio gain using the instantaneous energy value; and adjusting at least one gain stage of the communications device based on the processed at least one gain algorithm so the at least one microphone audio input when in a digital mode substantially approximates the at least one microphone audio input when in an analog mode.

9. A method for balancing microphone audio gain in claim 8, wherein the instantaneous energy value of the audio microphone input is determined using a mathematical square of an audio voltage present at the at least one microphone audio input.

10. A method for controlling audio gain balance as in claim 8, wherein the step of processing includes computing a polynomial using linear regression and the instantaneous energy value.

11. A method for balancing the audio output in a two-way radio receiver that operates in both first and second voice modes comprising the steps of:

providing at least one speaker input;

determining a desired voice gain algorithm when in the first voice mode;

determining an energy value of the at least one speaker input when in the second voice mode;

using a filter to normalize the energy value;

processing the desired voice gain algorithm using the energy value from the second voice mode; and dynamically adjusting at least one speaker gain stage using the processed desired voice gain algorithm such that the speaker gain when in the second voice mode substantially approximates a microphone gain when in the first voice mode wherein, the first voice mode is digital and the second voice mode is analog.

12. A method for controlling audio gain balance as in claim 11, wherein the energy value of the audio speaker input is determined using a mathematical square of an audio voltage present at the at least one speaker input.

13. A method for controlling audio gain balance as in claim 11, wherein the step of processing includes computing a polynomial using linear regression and the energy value.

* * * * *